(12) United States Patent
Chen et al.

(10) Patent No.: US 9,111,757 B2
(45) Date of Patent: Aug. 18, 2015

(54) DISPLAY HAVING A BACKPLANE WITH INTERLACED LASER CRYSTALLIZED REGIONS

(71) Applicant: APPLE INC., Cupertino, CA (US)

(72) Inventors: Yu Cheng Chen, Cupertino, CA (US); Hiroshi Osawa, Sunnyvale, CA (US); Shih Chang Chang, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 54 days.

(21) Appl. No.: 13/870,567

(22) Filed: Apr. 25, 2013

(65) Prior Publication Data

US 2014/0319468 A1    Oct. 30, 2014

(51) Int. Cl.
| | | |
|---|---|---|
| *H01L 29/04* | (2006.01) | |
| *H01L 21/336* | (2006.01) | |
| *H01L 21/02* | (2006.01) | |
| *H01L 27/32* | (2006.01) | |

(52) U.S. Cl.
CPC .......... *H01L 29/04* (2013.01); *H01L 21/02532* (2013.01); *H01L 21/02675* (2013.01); *H01L 21/02691* (2013.01); *H01L 27/3244* (2013.01)

(58) Field of Classification Search
CPC .............. H01L 29/04; H01L 21/02675; H01L 21/02592; H01L 21/02595; H01L 21/02532; H01L 27/3244

USPC ........ 257/40, 48, 75, 506, E21.521, E21.522, 257/E21.544, E27.111; 438/11, 15, 18, 487
See application file for complete search history.

(56) References Cited

U.S. PATENT DOCUMENTS

| | | | | |
|---|---|---|---|---|
| 6,521,910 | B1 * | 2/2003 | Lin ................................. | 257/48 |
| 7,054,219 | B1 * | 5/2006 | Petti et al. ................ | 365/230.06 |
| 7,501,651 | B2 * | 3/2009 | Sun et al. ......................... | 257/48 |
| 2001/0026260 | A1 * | 10/2001 | Yoneda et al. .................. | 345/98 |
| 2006/0076558 | A1 * | 4/2006 | Morita et al. ................... | 257/48 |
| 2008/0030877 | A1 | 2/2008 | Turk et al. | |
| 2008/0266954 | A1 * | 10/2008 | Eitan et al. ............... | 365/185.05 |
| 2011/0121306 | A1 | 5/2011 | Im et al. | |
| 2011/0221720 | A1 | 9/2011 | Kuo et al. | |
| 2012/0267348 | A1 | 10/2012 | Turk et al. | |

FOREIGN PATENT DOCUMENTS

WO     2011152854 A1    12/2011

* cited by examiner

*Primary Examiner* — Dao H Nguyen
(74) *Attorney, Agent, or Firm* — Fletcher Yoder PC (57) ABSTRACT

Systems including and methods for forming a backplane for an electronic display are presented. The backplane includes interlaced crystallized regions, and the interlaced crystallized regions include at least a left column of crystallized regions and a right column of crystallized regions. The left and right columns include rows of crystallized regions with gaps disposed between each of the rows. Furthermore, each crystallized region in the left column extends into a corresponding gap in the right column, and each crystallized region in the right column extends into a corresponding gap in the left column.

15 Claims, 8 Drawing Sheets

DISPLAY HAVING A BACKPLANE WITH INTERLACED LASER CRYSTALLIZED REGIONS

BACKGROUND

This disclosure relates to the manufacture of backplanes for electronic displays that enable more uniform display.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic displays appear in many electronic devices. Electronic displays often include a backplane to which other layers (e.g., transistor layer, organic light emitting diode layer) of the display are connected either directly or indirectly. Often the backplane is formed by depositing a first material (e.g., amorphous silicon) on a motherglass then crystallizing the material to a crystalline form of the material (e.g., poly-crystallized silicon) using a crystallization process (e.g., laser crystallization). However, there are limits to the crystallization processes. For example, the laser crystallization process is limited by the width of a laser beam used to crystallize the backplane. Furthermore, the laser beam width is limited by technology, power, and resources available. If the available laser beam width is less than the desired smallest dimension (e.g., width or height) of a backplane for a display, the laser may be "scanned" across the backplane two or more times. However, when each of these passes are made, each pass may be overlapped with a previous pass to insure that the entire backplane is crystallized. However, when a region is scanned in two adjacent passes, the properties of the crystallized material may vary from the surrounding portions of the backplane. When the crystallized material varies on the backplane, transistors connected to the display pixels may respond differently to voltages and result in variations in current flow through the transistors. Accordingly, a display including a non-uniform backplane may have a non-uniform appearance due to these variations in the crystallized material.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the present disclosure relate to systems and methods for providing a backplane for a uniform electronic display. Specifically, the backplane is formed using interlaced rows of crystallized material (e.g., poly-Si) to enable connections of transistors used to control individual pixels of the display. Instead of performing a solid scan to form a first column of crystallized material, a scan resulting in the first column may leave gaps between each row that is slightly larger than each row. The gaps left in the first column partially receive rows of a second column that is formed similar to the first column. In other words, rows from the second column extend into gaps in the first column, and rows from the second column extend into the first column. Additional rows may be also added in subsequent laser scans. By leaving gaps in each column that accommodates rows from one or more adjacent columns, electrical connections may be provided for each pixel of the display without scanning any portion of the backplane more than once, which may lead to non-uniformities in the display. Additionally, less crystallized material and/or resources (e.g., power) may be consumed in forming the backplane.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

This disclosure generally relates to a backplane for a uniform electronic display. Specifically, the backplane may provide a uniform display, especially in large electronic displays. The backplane includes interlaced rows of crystallized material (e.g., poly-Si) that each enables connections of transistors used to control individual pixels of the display. Gaps left in one column partially receive rows of one or more other columns. By leaving gaps in each column that accommodates rows from one or more adjacent columns, electrical connections may be provided for each pixel of the display without scanning any portion of the backplane more than once, which may lead to non-uniformities in the display.

Such an interlaced row pattern on the backplane may also reduce resources used to form the backplane. For example, a laser crystallization process using the interlaced rows of the disclosure may use smaller and/or older lasers that may be cheaper to acquire than larger lasers. Additionally, less of the backplane is refined using the laser. Accordingly, some embodiments may reduce the amount of time that the laser is online, thereby reducing power consumed in the backplane formation process. In certain embodiments, where amorphous silicon is deposited only on locations to be crystallized, less material may be used and/or more material may be recovered, thereby reducing production costs of the backplane.

Finally, this disclosure tends to describe efficient timing circuitry for use with an organic light emitting diode (OLED). However, the efficient timing circuitry may be employed using any suitable type of electronic display that uses crystallized silicon. For example, other electronic displays that employ a matrix of pixels, such as liquid crystal displays (LCD), may also employ the uniform backplane of this disclosure.

Figure 1:
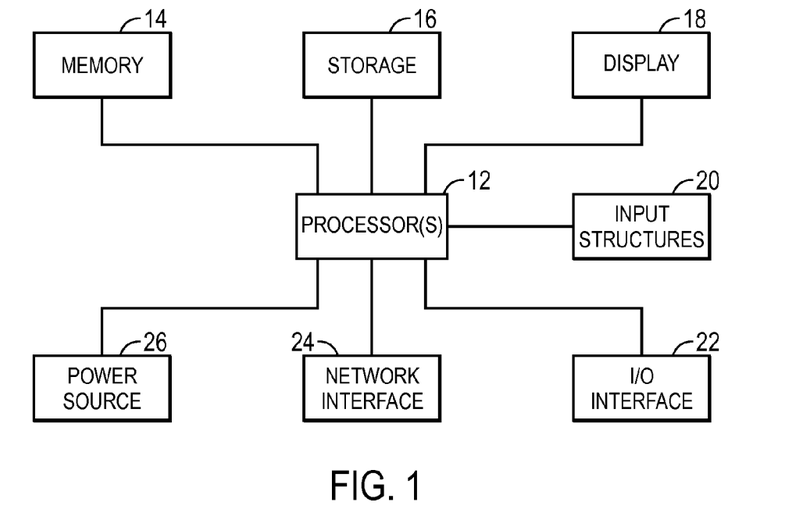
FIG. 1 is a block diagram of an electronic device having a display with a substrate incorporating alternating laser scan areas in accordance with an embodiment.
Figure 2:
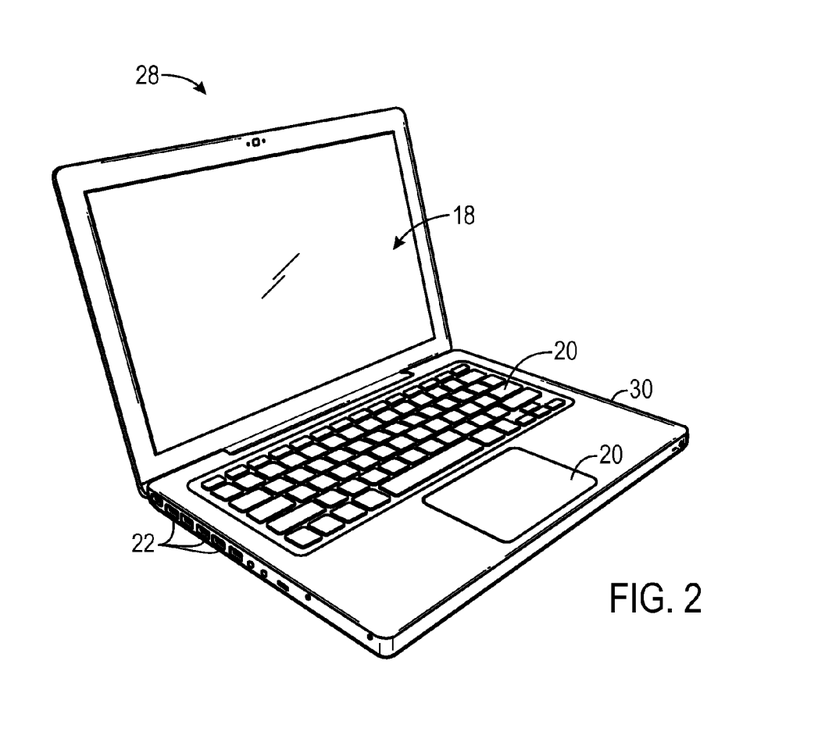
FIG. 2 is a perspective view of the electronic device of FIG. 1 in the form of a notebook computer, in accordance with an embodiment.
Figure 3:
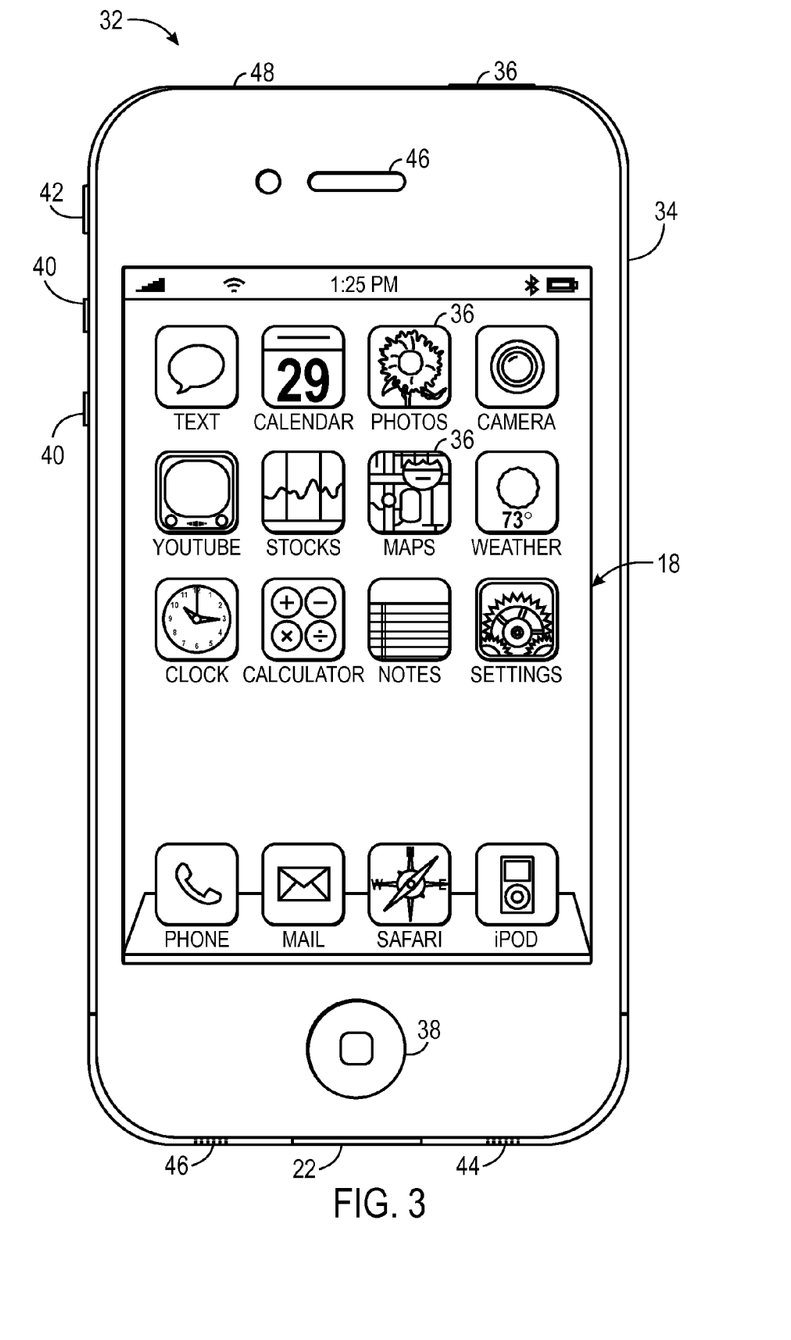
FIG. 3 is a front view of the electronic device of FIG. 1 in the form of a handheld device, in accordance with an embodiment.

Indeed, many suitable electronic devices may use displays that incorporate substrates that include interlaced laser scan lines used to perform poly-silicon (polySi) crystallization. For example, FIG. 1 is a block diagram depicting various components that may be present in an electronic device suitable for use with such a display. FIGS. 2 and 3 respectively illustrate perspective and front views of suitable electronic devices. Specifically, FIGS. 2 and 3 illustrate a notebook computer and a handheld electronic device, respectively.

Turning first to FIG. 1, an electronic device 10 according to an embodiment of this disclosure may include, among other things, one or more processor(s) 12, memory 14, nonvolatile storage 16, a display 18, input structures 20, an input/output (I/O) interface 22, network interfaces 24, and/or a power source 26. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in the electronic device 10.

By way of example, the electronic device 10 may represent a block diagram of the notebook computer of FIG. 2, the handheld device of FIG. 3, or similar devices. In the electronic device 10 of FIG. 1, the processor(s) 12 and/or other data processing circuitry may be operably coupled with the memory 14 and the nonvolatile memory 16 to execute instructions. For instance, the processor(s) 12 may generate image data to be displayed on the display 18. The display 18 may be a touch-screen liquid crystal display (LCD). In some embodiments, the electronic display 18 may be a Multi-Touch™ display that can detect multiple touches at once. The display 18 may include a substrate that includes interlaced laser scan lines from the laser crystallization process to increase uniformity of appearance of the display 18.

The input structures 20 of the electronic device 10 may enable a user to interact with the electronic device 10 (e.g., pressing a button to increase or decrease a volume level). The I/O interface 22 may enable electronic device 10 to interface with various other electronic devices, as may the network interfaces 24. The network interfaces 24 may include, for example, interfaces for a personal area network (PAN), such as a Bluetooth network, for a local area network (LAN), such as an 802.11x Wi-Fi network, and/or for a wide area network (WAN), such as a 3G or 4G cellular network. The power source 26 of the electronic device 10 may be any suitable source of power, such as a rechargeable lithium polymer (Li-poly) battery and/or an alternating current (AC) power converter.

The electronic device 10 may take the form of a computer or other suitable type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 28, is illustrated in FIG. 2 in accordance with one embodiment of this disclosure. The depicted computer 28 may include a housing 30, a display 18, input structures 20, and ports of an I/O interface 22. In one embodiment, the input structures 20 (such as a keyboard and/or touchpad) may be used to interact with the computer 28, such as to start, control, or operate a GUI or applications running on computer 28. In some embodiments, the display 18 may include a computer monitor, display integrated within the electronic device, standalone display (e.g., television), or other suitable electronic displays. Moreover, the display 18 may include a substrate that includes interlaced laser scan lines from the laser crystallization process to increase uniformity of appearance of the display 18. The interlaced laser scan lines increase uniformity of appearance by reducing or eliminating application of laser crystallization to a portion of the substrate already crystallized with leaving horizontal spaces between scan lines. By reducing or eliminating multiple scans of portions of the substrate, the substrate has more uniform electrical properties thereby increasing the uniformity of appearance of a display 18 incorporating the substrate.

FIG. 3 depicts a front view of a handheld device 32, which represents one embodiment of the electronic device 10. The handheld device 32 may represent, for example, a portable phone, a media player, a personal data organizer, a handheld game platform, or any combination of such devices. By way of example, the handheld device 32 may be a model of an iPod® or iPhone® available from Apple Inc. of Cupertino, Calif. In other embodiments, the handheld device 32 may be a tablet-sized embodiment of the electronic device 10, which may be, for example, a model of an iPad® available from Apple Inc.

The handheld device 32 may include an enclosure 34 to protect interior components from physical damage and to shield them from electromagnetic interference. The enclosure 34 may surround the display 18. The I/O interfaces 24 may open through the enclosure 34 and may include, for example, a proprietary I/O port from Apple Inc. to connect to external devices. User input structures 36, 38, 40, and 42, in combination with the display 18, may allow a user to control the handheld device 32. For example, the input structure 36 may activate or deactivate the handheld device 32, the input structure 38 may navigate a user interface to a home screen, a user-configurable application screen, and/or activate a voice-recognition feature of the handheld device 32, the input structures 40 may provide volume control, and the input structure 42 may toggle between vibrate and ring modes. A microphone 44 may obtain a user's voice for various voice-related features, and a speaker 46 may enable audio playback and/or certain phone capabilities. A headphone input 48 may provide a connection to external speakers and/or headphones. The display 18 of the handheld device 32 may include a substrate that includes interlaced laser scan lines from the laser crystallization process to increase uniformity of appearance of the display 18. The interlaced laser scan lines increase uniformity of appearance by reducing or eliminating application of laser crystallization to a portion of the substrate already crystallized with leaving horizontal spaces between scan lines. By reducing or eliminating multiple scans of portions of the substrate, the substrate has more uniform electrical properties thereby increasing the uniformity of appearance of a display 18 incorporating the substrate.

Figure 4:
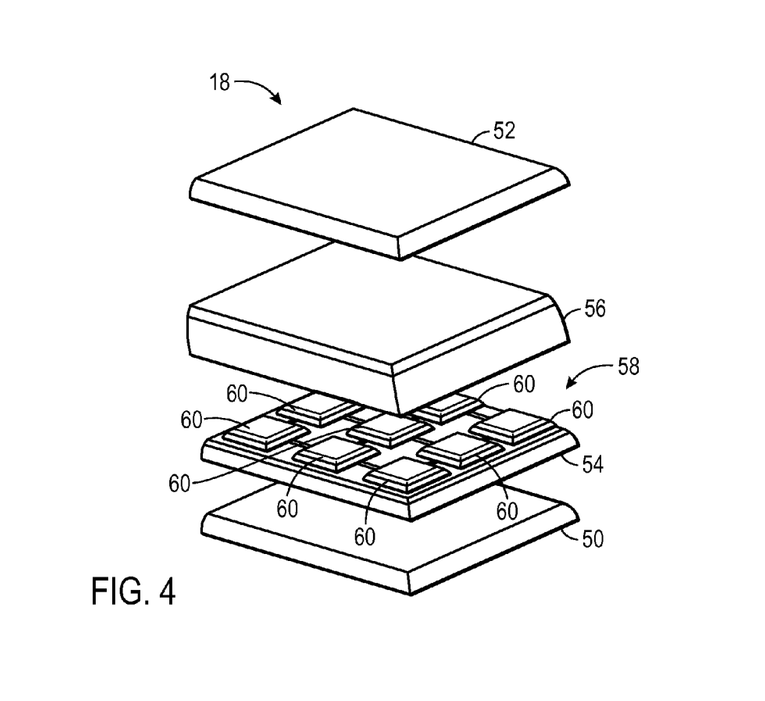
FIG. 4 is an exploded view of the display of FIG. 1 having a substrate incorporating alternating laser scan areas and a TFT layer, in accordance with an embodiment.

FIG. 4 is an exploded view of an embodiment the display 18 including organic light-emitting diodes (OLEDs). In certain embodiments, the OLEDs may include active-matrix organic light-emitting diodes (AMOLEDs) that use an active matrix of thin-film transistors (TFTs) to drive individual pixels of the display 18. In some embodiments, the OLEDs may include passive-matrix organic light-emitting diodes (PMOLEDs). Some embodiments include a combination of AMOLEDs and PMOLEDs in a single display. Moreover, in some embodiments, the display 18 includes a protective housing 50 that at least partially blocks internal components from interference from external objects such as moisture or particulates. In embodiments having a transparent OLED, this protective housing 50 may be a transparent material (e.g., glass, plastic, etc.). In certain embodiments, the protective housing 50 may extend around all sides of the display. In some embodiments, the protective housing 50 may cover the bottom and sides of the display 18 with an upper housing 52 protecting a display surface of the display 18. In certain embodiments, the upper housing 52 includes a substantially transparent layer such as glass or plastic.

The display also includes a substrate 54. The substrate 54 supports an OLED layer 56. In embodiments of the display 18 that include AMOLEDs, the substrate 54 may be coupled to a thin film transistor layer 58 that is used to drive individual pixels of the display 18. The substrate 54 may be any suitable materials for supporting the OLED layer 56 and enabling the TFT layer 58 to be formed. In some embodiments, the substrate 54 includes a mother glass on which additional layers (e.g., amorphous silicon to be crystallized) are added to form the substrate 54. Additional factors may be used to determine the material composing the substrate 54. For instance, if the display 18 is desired to be transparent, a transparent substrate may be used. If the display 18 is desired to be bendable, a flexible material (e.g., metallic foils or plastics) may be used to form the substrate 54. Moreover, in a top-emitting OLED, the substrate 54 may be composed of a material that is opaque and/or reflective. In some embodiments, portions of the substrate 54 may be selected from various semi-conductive materials according to desired properties of the display 18, such as glass, plastic, metallic foil, or polycrystalline silicon (poly-Si). In some embodiments, the protective housing 50 may be incorporated the substrate 54 into such that the substrate 54 supports the OLED layer 56 and protects internal components of the display 18.

The OLED layer 56 includes multiple layers such as an anode, a cathode, a conductive layer, and an emissive layer. The anode layer includes multiple anodes formed from a high work function material (e.g., indium tin oxide) that promotes injections of "holes" into the conductive layer. Each anode couples to a respective pixel circuitry unit 60 of the TFT layer 58 that removes electrons or adds "holes" when current flows through the OLED layer 56. The conducting layer is formed from organic plastic molecules (e.g., polyaniline) that transport the holes from the anode to the emissive layer. The emissive layer is formed from organic plastic molecules (e.g., polyfluorene) different than those used in the conducting layer. The emissive layer transports electrons from the cathode to fill the holes transported from the conducting layer. When the electrons fill the holes, excess energy is created and emitted in the form of light. The color of the light emitted depends upon the type of organic molecule used in the emissive layer. Moreover, the brightness of the light depends upon the amount of electrical current applied to the OLED layer 56 through the TFT layer 56. In some embodiments, the display 18 includes touch detection capabilities. In certain embodiments of the display 18 including touch detection, a separate and additional touch sensing layer may be incorporated into the display 18. In some embodiments, touch sensing functions may be incorporated into the OLED layer 56.

Although FIG. 4 illustrates an embodiment of a top emission AMOLED, other embodiments of the display 18 may include a bottom-emission AMOLED that has the OLED layer 56 disposed between the TFT layer 58 and the substrate 54.

Figure 5:
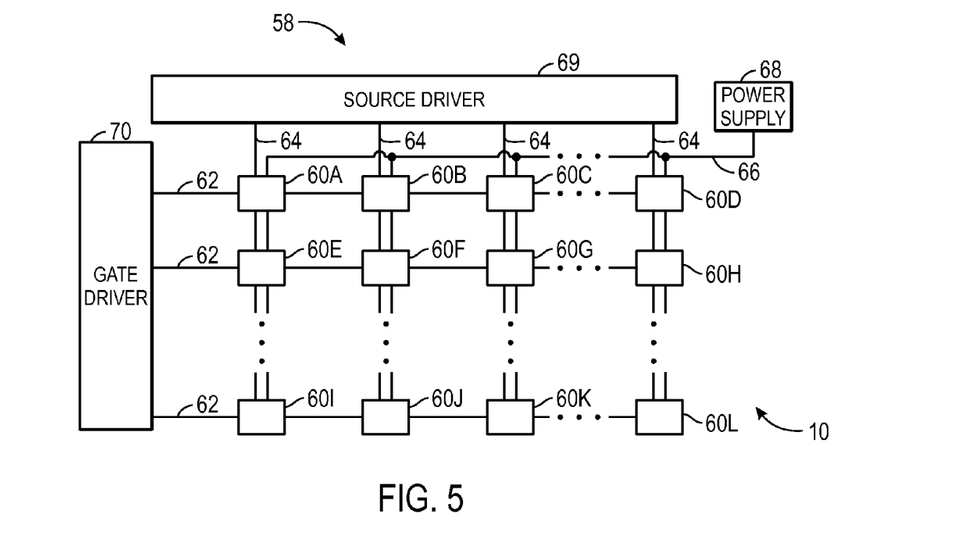
FIG. 5 is a front view of the TFT layer of FIG. 4, in accordance with an embodiment.

As mentioned, the display 18 of the electronic device may be an AMOLED display. The display 18 includes a matrix of TFTs in a TFT layer 58 that contains circuitry for controlling current flow through the OLED layer 56. Accordingly, FIG. 5 illustrates circuitry including a portion of a matrix of pixels of the display 10. Moreover, the TFT layer 58 may include multiple pixel circuitry unit 60 arranged as an array or matrix defining multiple rows and columns of pixel circuitry unit 60 that collectively control current through individual OLEDs of the OLED layer 56 to form a viewable region of the display 18 in which an image may be displayed. In such an array, pixel circuitry unit 60 may be defined by the intersection of rows and columns, represented here by the illustrated gate lines 62 (also referred to as "scanning lines") and source lines 64 (also referred to as "data lines"), respectively. Additionally, power supply lines 66 may provide power to each pixel circuitry unit 60 from a power supply 68.

Additionally, display 10 includes a source driver 69, which may include a chip, such as a processor or ASIC, configured to control appearance of the display 10. For example, the source driver 69 may receive image data from the processor 12 and send signals to the pixel circuitry units 60 to cause corresponding illumination of OLEDs in the OLED layer 56. The source driver 69 may also be coupled to a gate driver 70, which may include a chip, such as a processor or ASIC, configured to provide/deny access to rows of pixel circuitry units 60 via the gate lines 62. The source driver 69 may include a timing controller that determines and sends timing information to the gate driver 70 to facilitate activation and deactivation of individual rows of pixel circuitry units 60. In other embodiments, timing information may be provided to the gate driver 70 in some other manner (e.g., using a timing controller that is separate from the source driver IC 69). Further, while FIG. 4 depicts only a single source driver 69, it should be appreciated that other embodiments may utilize multiple source drivers 69 to provide image signals to the pixel circuitry units 60. For example, additional embodiments may include multiple source drivers 69 disposed along one or more edges of the display 10, with each source driver 69 being configured to control a subset of the source lines 64 and/or gate lines 62.

Although only twelve pixel circuitry units, referred to individually by reference numbers 60a-60l, respectively, are shown, it should be understood that in an actual implementation, each source line 64 and gate line 62 may include hundreds or thousands of such unit pixels 62. By way of example, in a display 18 having a display resolution of 1136×640, each source line 64, which may define a column of a pixel array, may include 640 groups of pixel circuitry units 60, while each gate line 62, which may define a row of the pixel array, may include 1,136 groups of pixel circuitry units 60 with each group including a red, blue, and green pixel circuitry unit 60 that each respectively corresponds to a red, blue, or green portion of the OLED layer 56. In other words, a display having a 1136×640 resolution includes 3,408 pixel circuitry units 60 per gate line 62. By way of further example, the panel 60 may have a resolution of 480×320, 960×640, 1024×768, 1280×720, or other suitable resolutions. In the presently illustrated example, the pixel circuitry units 60a-60c may correspond to a group of pixels having a red pixel unit (60a), a blue pixel unit (60b), and a green pixel unit (60c). The group of pixel circuitry units 60e-62g may be arranged in a similar manner. Additionally, in the industry, it is also common for the term "pixel" may refer to a group of adjacent different-colored pixels (e.g., a red pixel, blue pixel, and green pixel), with each of the individual colored pixels in the group being referred to as a "sub-pixel."

Each pixel circuitry unit 60 includes various electrical components configured to control emission of light by a corresponding OLED of the OLED layer 56. For example, each pixel circuitry units 60 includes at least one TFT that receives a signal from a respective gate line 62 and a respective source line 64 that causes current to flow through a corresponding OLED of the OLED layer 56 thereby causing the OLED to emit light, as discussed above. As previously discussed, variations in current through each OLED causes the OLED to vary according to the current passed through the OLED. In other words, OLEDs may be sensitive to non-uniformities between pixel circuitry units 60. Accordingly, each pixel circuitry units 60 may include additional circuitry (e.g., TFTs) that attempt to improve uniformity to control current to increase uniformity. However, if the TFTs used to control two or more OLEDs are not uniform, the OLEDs may not be uniform in appearance.

One cause of non-uniformity in the TFTs may occur in non-uniformities in the substrate 54 upon which the TFT layer 58 is formed. For example, non-uniformities in the substrate 54 may result from limitations of laser beam scan width in a laser crystallization process used to create the substrate. Laser crystallization formation of the substrate 54 includes depositing a non-crystalline allotropic form of a material (e.g., amorphous silicon) then submitting the non-crystalline form to a laser that melts the non-crystalline form to create a crystalline form (e.g., poly-Si). Often the laser beam scan width is limited by various factors, such as laser power limitations, optics limitations, laser beam shape, and expenses. When a display 18 is desired to have a size such that both its height and width are greater than a possible width of a single laser beam scan (e.g., 750 mm), multiple scans must be performed to create the substrate 54. For example, when a laser beam scan width is 750 mm, the maximum size display possible from a single scan is a 55-inch display. To create a larger display, a laser must pass over the substrate 54 more than once, and to ensure total coverage of the substrate, each scan of the laser overlaps with a previous scan. This area of overlap between scans can lead to non-uniformity between the portions subjected to a single laser scan and the portions subjected to additional laser scans (e.g., overlapped regions). The overlapped regions may result in different properties of the substrate 54 that cause TFTs formed in the overlapped regions to behave differently than TFTs formed in the single-scanned regions that may result in a pixel in an overlapped region to have a different appearance (e.g., cloudy or brighter depending on variety of factors) than a pixel in a single-scanned region.

Figure 6:
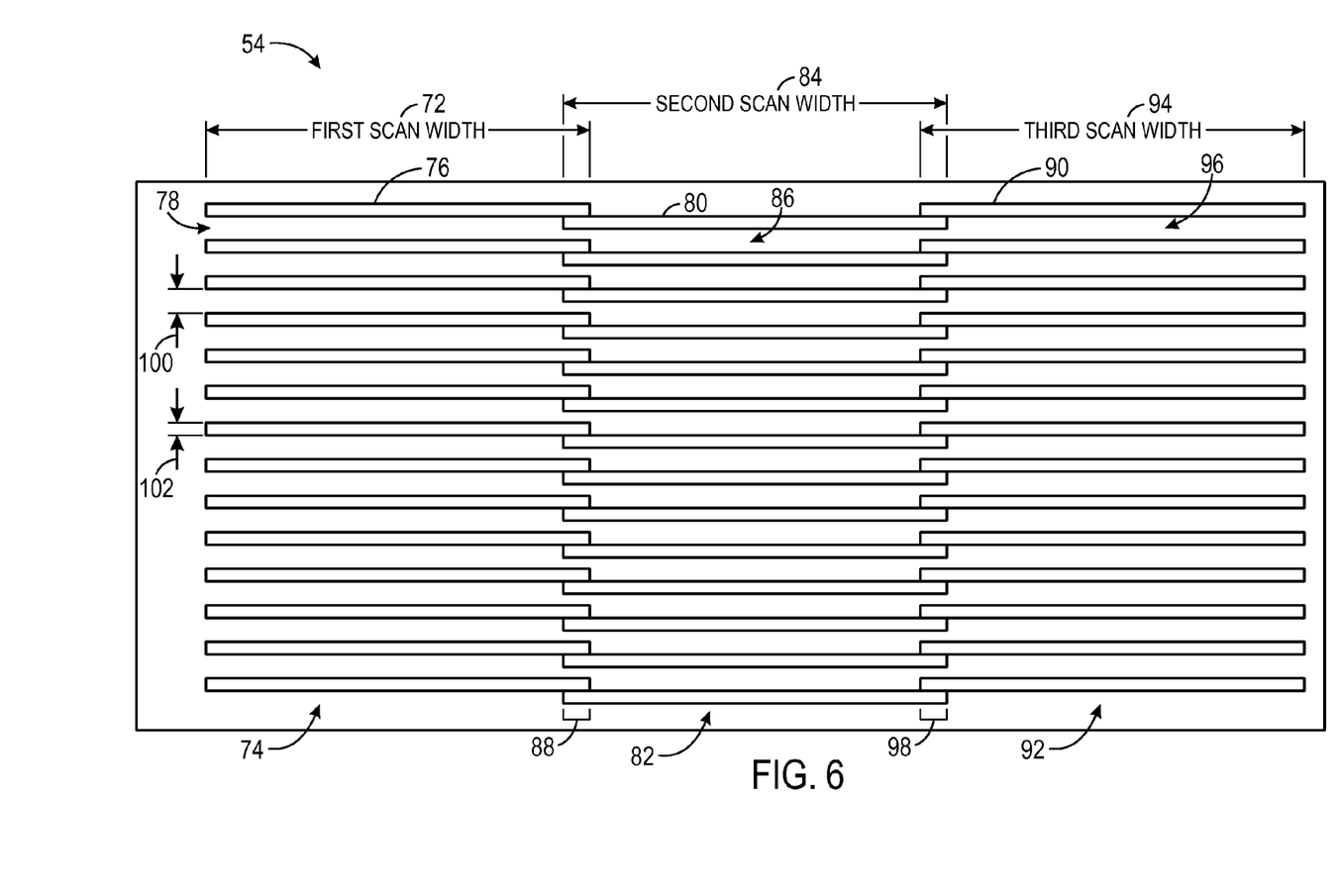
FIG. 6 is front view of the substrate of FIG. 4 incorporating three columns of alternating laser scan areas, in accordance with an embodiment.

FIG. 6 illustrates an embodiment of a substrate 54 with interleaved scan lines to improve uniformity of the display 18 by performing laser scans with gaps to accommodate the next laser scan to enable overlap of scans without processing any portion of the substrate 54 more than once. The illustrated embodiment of the substrate 54 includes 3 rows of laser scans, but other embodiments of the substrate may include 2 or more laser scans.

In some embodiments, a first material (e.g., a-Si) may only be deposited over a portion of the substrate 54. For example, some embodiments of the substrate 54 may originate with a-Si deposited only on portions (e.g., using a mask) that will be subsequently crystallized. In other embodiments, a-Si may be deposited on the entire substrate 54, but only the portions that are crystallized, as discussed below, are refined to poly-Si.

As illustrated, a first scan is performed with a first scan width 72 that results in a first row 74 of multiple crystallized material regions 76. The first row 74 includes gaps 78 between the crystallized material regions 76 that are not scanned by the laser. The gaps 78 may at least partially receive crystallized material regions 80 of the second row 82 when a second scan is performed with the second scan width 84. Moreover, a portion of the crystallized material regions 76 of the first row 74 may be located in gaps 86 between the crystallized material regions 80 of the second row 82. In other words, the crystallized material regions 76 of the first row 74 and the crystallized material regions 80 of the second row 82 may laterally overlap in an overlap region 88 while being located in gaps 78 and 86 so as to enable formation of TFTs in the substrate 54 with increased uniformity due to a lack of repeated laser scans on a single location in the overlap region 88.

Similar to the second row 82, additional crystallized material regions 90 may be disposed on the substrate 54 in a third row 92 having a third scan width 94 with gaps 96 between the crystallized material regions 90. Although three rows are illustrated, some embodiments include a substrate having two or more rows of laser scanned rows. For example, some embodiments of the substrate 54 may include 2, 3, 4, 5, or more rows of laser scanned rows. Moreover, a width 100 of the gaps 78, 86, and 96 may be selected to be slightly smaller than a width 102 of the crystallized material regions 76, 80, and 90 so that the width 102 of crystallized material regions 76, 80, and 90 may be wholly disposed within the width 100 of one or more of the respective gaps 78, 86, and 96. Furthermore, in some embodiments, the first scan width 72, the second scan width 84, and the third scan width 94 may have equivalent sizes so that a single laser size may be used to perform laser scans of the substrate 54. In other embodiments, the first scan width 72, the second scan width 84, and/or the third scan width 94 may differ in size. By using different size of laser scan widths, older and/or cheaper laser resources may be used to perform subsequent laser scans at a shorter width as long as the sum of the scan widths are capable of achieving a desired size for the substrate.

Figure 7:
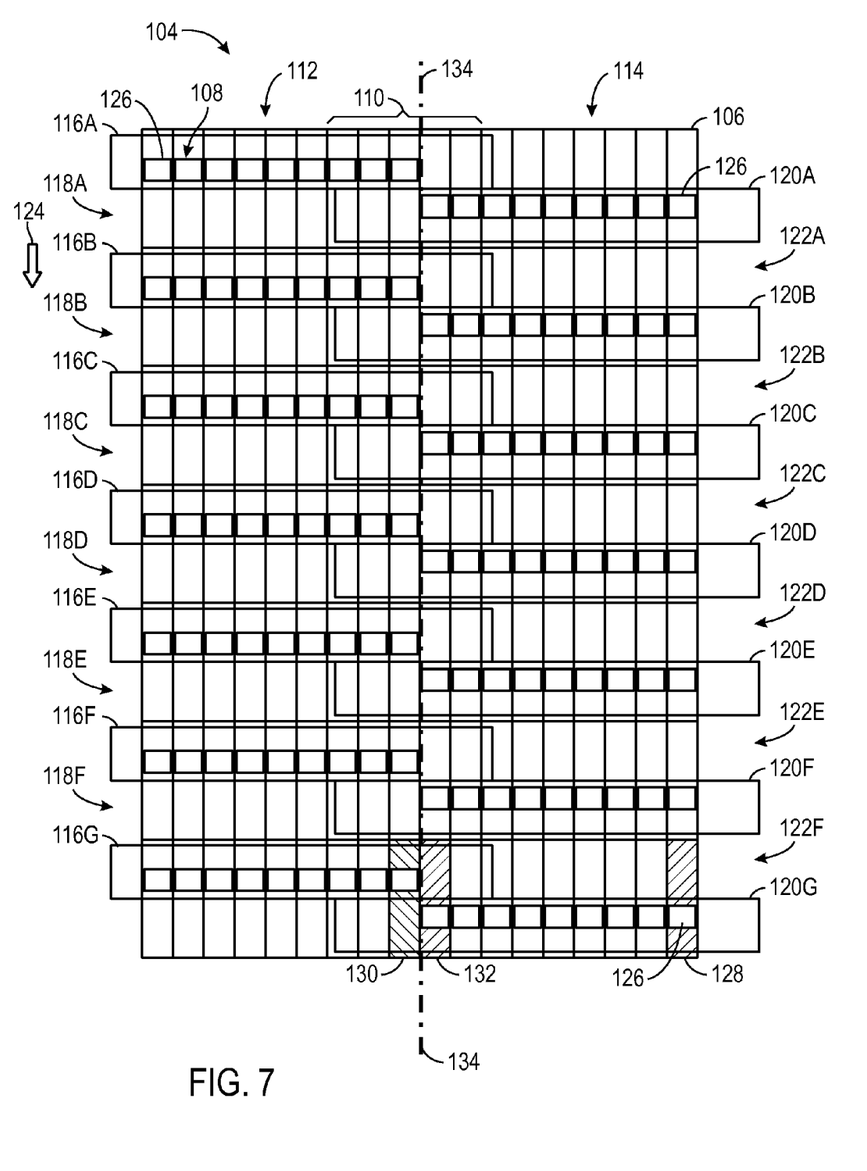
FIG. 7 is a front view of the substrate of FIG. 6 and TFT layer of FIG. 5 incorporating a linear transition line, in accordance with an embodiment.
Figure 8:
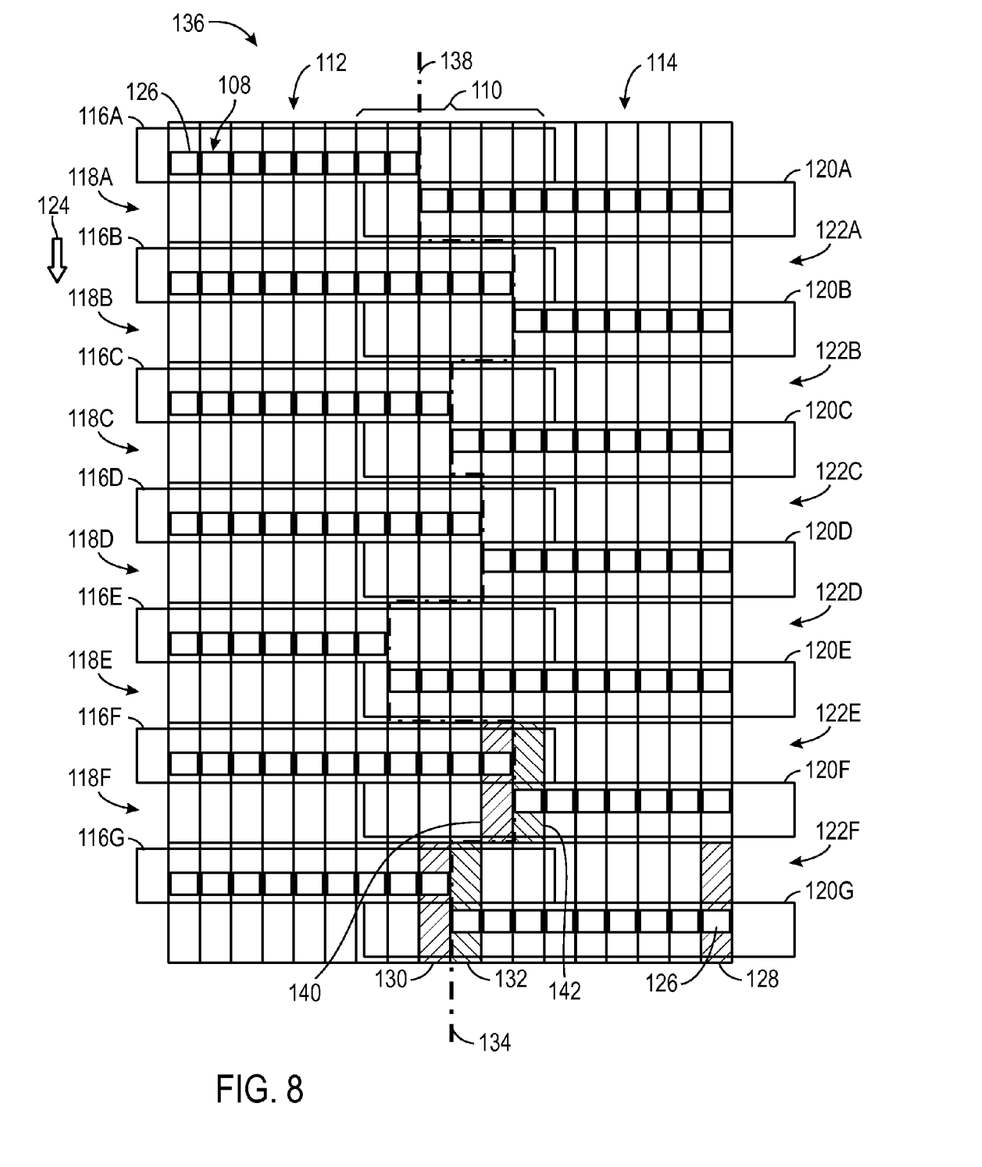
FIG. 8 is a front view of the substrate of FIG. 6 and TFT layer of FIG. 5 incorporating a non-linear transition zone, in accordance with an embodiment.
Figure 9:
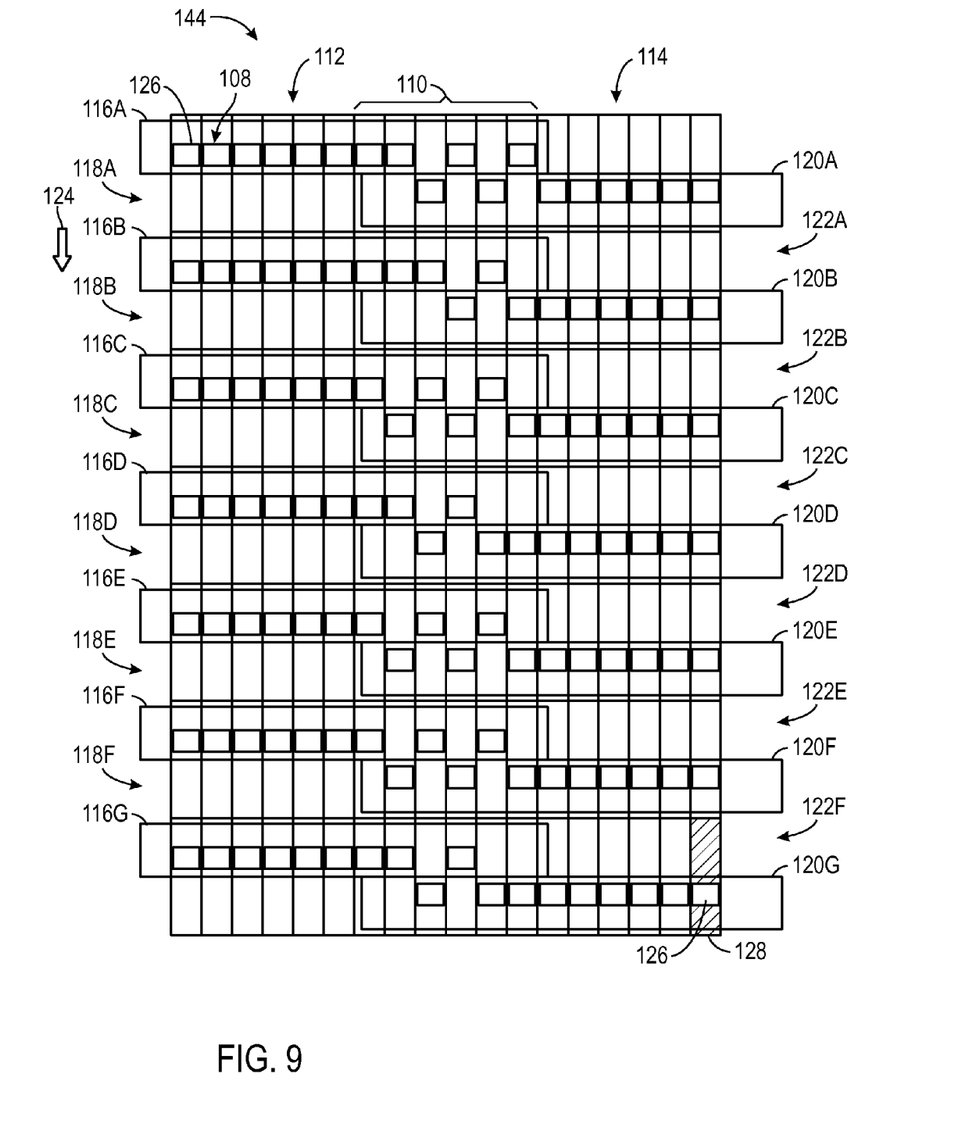
FIG. 9 is a front view of the substrate of FIG. 6 and TFT layer of FIG. 5 incorporating an alternating transition between laser scan columns, in accordance with an embodiment.

After the substrate 54 has been prepared using laser crystallization, the TFT layer 58 can be formed in the substrate 54. FIGS. 7-9 illustrate various possible embodiments of arranging the pixel circuitry units 60 of the TFT layer 58 when formed in the substrate 54. FIG. 7 is a front view of an embodiment of a portion of a display array 106 that includes a substrate 104 formed in a TFT layer 108. As illustrated, the substrate 104 includes an overlap region 110 similar to the overlap regions 88 or 98 of FIG. 6. Specifically, the overlap region 110 includes lateral extensions of a left column 112 and a right column 114 extending into the overlap region 110 from respective left and right directions. The left column 112 includes multiple crystallized regions 116 referred to individually by reference numbers 116a-116g, respectively. The crystallized regions 116 are spaced with multiple gaps 118 referred to individually by reference numbers 118a-118f, respectively. Specifically, each gap (e.g., 118a) is located between two adjacent crystallized regions 116 (e.g., 116a and 116b). Similarly, the right column 114 includes multiple crystallized regions 120 referred to individually by reference numbers 120a-120g, respectively spaced with multiple gaps 122 referred to individually by reference numbers 122a-122f, respectively. As illustrated, the crystallized regions 116 of the first column 112 extend into the gaps 122 of the second column 114 within the overlap region 110, and the crystallized regions 120 of the second column 114 extend into the gaps 118 of the first column 112 within the overlap region 110. For example, the crystallized region 116b extends into the gap 122a of the second column 114 in the overlap region 110, and the crystallized region 120a extends into the gap 118a of the first column 112 in the overlap region 110. Furthermore, although the illustrated embodiment includes only seven rows of crystallized regions in each column, it should be understood that the amount of rows in each column is equal to a desired amount of pixels (e.g., 1,136) for the display array 104 along the scan direction 124 according to the resolution of the display.

Furthermore, the TFT layer 108 includes pixel circuitry units 126 each formed in a crystallized region 116 or 120. On top of each pixel circuitry unit 126, an anode of a OLED is coupled to the pixel circuitry unit 126 with the pixel circuitry unit controlling current flow through the OLED, thereby controlling the brightness of the OLED. Each OLED generally overlays a respective pixel circuitry unit 126 in an OLED region such that each OLED covers a pixel circuitry unit 126 and a corresponding region in a respective gap 118 or 122. For example, the OLED coupled to the pixel circuitry unit 126 in the OLED region 128 overlays a portion of the crystallized region 120g and the corresponding gap 122f. Accordingly, adjacent OLEDs, such as those corresponding to OLED regions 130 and 132 may appear uniform despite the formation of the pixel circuitry unit 126 in the crystallized region 116g in the OLED region 130 and the formation of the pixel circuitry unit 126 in the crystallized region 120g in the OLED region 132.

In the current embodiment, the pixel circuitry units 126 are formed in crystallized regions 116 of the first column 112 in portions of the overlap region 110 right of a generally vertical transition line 134 and to the crystallized regions 120 of the second column 114 in portions of the overlap region 110 right of the transition line 134. For example, the pixel circuitry unit 60 in the OLED region 130 is formed in the crystallized region 116g, and the pixel circuitry unit 60 in the OLED region 132 is formed in the crystallized region 120g. Additionally, although the OLED regions 130 and 132 are displayed as rectangular-shaped regions, it should be appreciated that OLED regions in OLED layer 56 may be formed in any desired shape, such as chevron-shaped or wave-shaped.

FIG. 8 is a front view of a display array 136 that has an alternative orientation of pixel circuitry units 126. As illustrated, a transition zone 138 is used to delineate the transition from forming the pixel circuitry units 126 in the crystallized regions 116 of the left column 112 to forming the pixel circuitry units 126 in the crystallized regions 120 of the right column 114. The transition zone 138 is generally not vertical by offsetting horizontally offsetting transitions between consecutive rows to reduce the appearance of non-uniformities that may result from differences (e.g., different lasers, different timing of crystallization, gradiations of substrate, etc.) between the crystallized regions 116 of the left column 112 and the crystallized regions 120 of the right column 114. Using a non-linear transition zone 138 may reduce the ability of observers to notice a transition from the left column 112 to the right column 114. In other words, a non-linear transition zone 138 softens an edge between the left column 112 and the right column 114 such that any differences in appearance between OLEDs corresponding to the crystallized regions 116 and 120 are not vertically aligned to reduce the appearance of differences between OLEDs. Specifically, if the appearance of OLEDs corresponding to OLED region 130 differs from the appearance of OLEDs corresponding to the OLED region 132, a vertical alignment of similar differences as shown in FIG. 7 may increase the noticeability of the differences. Instead, by staggering these changes, these differences may be at least partially concealed. For example, by offsetting a transition from OLED region 140 to OLED region 142 to a position not directly above the transition from OLED region 130 to OLED region 132, the differences may be less apparent to an observer.

FIG. 9 is front view of a display array 144 with an interlaced orientation of pixel circuitry units 126 in the overlapping region 110. As illustrated, the display array 144 includes alternating pixel circuitry units 126 between the crystallized region 116 of the left column 112 and the crystallized region 120 of the right column 114. By alternating the pixel circuitry units 126 between the crystallized region 116 of the left column 112 and the crystallized region 120 of the right column 114, the transition from the left column 112 and the right column 114 is softened by feathering the two columns together, thereby reducing the likelihood of differences between the two columns being apparent to an observer. In some embodiments, the alternation of the pixel circuitry units 126 may be uniform in each row of the overlapping region 110. In other embodiments, such as the illustrated embodiment, the orientation of pixel circuitry units 126 may vary by row. For example, in the illustrated embodiment, the row formed by crystallized regions 116a and 120a alternates between crystallized regions 116a and 120a at the edge of the overlapped region 110, but the row formed by crystallized regions 116b and 120b offsets the alternation by one pixel circuitry unit 126 before alternating between the crystalline regions 116 and 120. Moreover, the row formed by crystalline regions 116c and 120c alternates between the crystalline regions 116c and 120c at the edge of the overlapping region 110 similar to but inverse from the row formed from crystalline regions 116a and 120a. Certain embodiments include any of the illustrated embodiments in any combination suitable for connecting the pixel circuitry units, such as inverting the alternation between consecutive rows 116 and/or 118.

Figure 10:
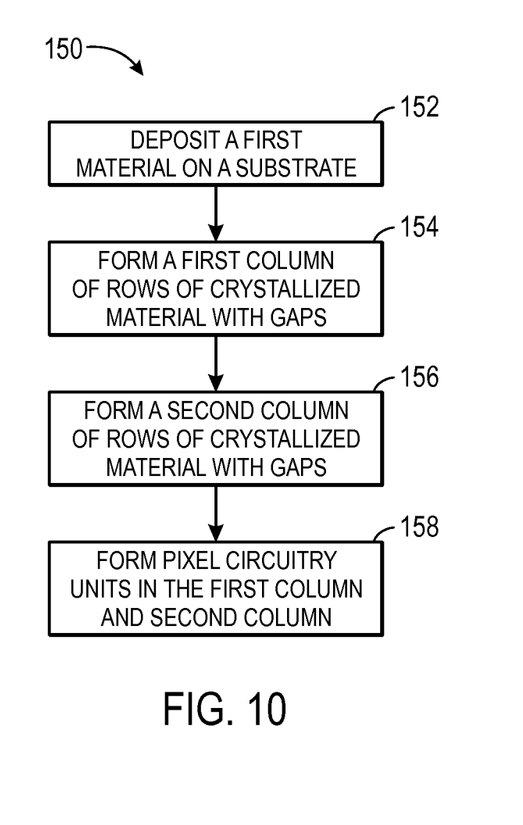
FIG. 10 is a flow diagram view a method of manufacturing a display of the electronic device of FIG. 1, in accordance with an embodiment.

FIG. 10 is a flow diagram illustrating an embodiment of a process 150 for manufacturing a backplane that may be used in the electronic display 18. The process 150 includes depositing a first material on a substrate (block 152). The first material may include an allotropic form of semiconductor, such as a-Si. The process 150 also includes forming a first column of crystallized material with gaps (block 154). The first column is formed using a refinement process, such as a laser crystallization process that refines a-Si into poly-Si. When the first column of rows is formed gaps are left between the rows such that there is a vertical distance between adjacent rows of the first column of rows. Moreover, the gaps are selected to be slightly larger than the rows. The process also includes forming a second column of rows of crystallized material with gaps (block 156). The formation of the second column is similar to the formation of the first column. However, at least a portion of each row of the second column protrudes into the gaps of the first column, and at least a portion of each row of the first column protrudes into the gaps of the second column. In other words, the columns overlap, but the rows are arranged as "interlocking fingers" instead forming rows that are overlaid on top of each other. Accordingly, no portion of the backplane is crystallized twice, thereby increasing uniformity of the backplane and any display that incorporates the backplane.

Furthermore, the process 150 includes forming pixel circuitry units (e.g., one or more transistors, capacitors, and other electronic circuitry) in the first and second column of rows of crystallized material (block 158). In some embodiments, a transition from forming the pixel circuitry units in the first column to forming the pixel circuitry units in the second column may be linearly divided in an overlapping region between the two columns, such as the embodiment illustrated in FIG. 7. In other embodiments, this transition may be non-linear such that the transition for each row is offset from a transition of an adjacent row, such as the embodiment illustrated in FIG. 8. Moreover, further embodiments may alternate forming the pixel circuitry units in the first column to forming the pixel circuitry units in the second column in an alternating orientation, such as the embodiment illustrated in FIG. 9.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A backplane for an electronic display comprising:
a first column comprising:
a plurality of left rows of crystallized material, wherein the plurality of left rows are vertically aligned in the first column; and
a plurality of left gaps disposed between each of the rows of the first column; and
a second column comprising:
a plurality of right rows of crystallized material, wherein the plurality of right rows are vertically aligned in the second column; and
a plurality of right gaps disposed between each of the right rows of the second column, wherein each of the left rows of the plurality of left rows is at least partially disposed within a corresponding right gap of the plurality of right gaps, and wherein each of the second rows of the plurality of second rows is at least partially disposed in a corresponding left gap of the plurality of the left gaps; and
a plurality of pixel circuitry units coupled to the plurality of left and right rows of crystallized material, wherein the every other pixel circuitry unit of the plurality of pixel circuitry units in an intermeshed region including both columns is coupled to a left row of the plurality of left rows and the intervening pixel circuitry units are coupled to a right row of the plurality of right rows.

2. The backplane of claim 1, wherein the left and right rows of crystallized material comprise polycrystalline silicon.

3. The backplane of claim 1, wherein the plurality of left rows and the plurality of right rows are each configured to enable a formation of a plurality of transistors.

4. An electronic display comprising:
a backplane comprising:
a first column of a first plurality of rows of crystallized material vertically spaced by a first plurality of gaps;
a second column of a second plurality of rows of crystallized material vertically spaced by a second plurality of gaps; and
an overlap region comprising:
interlocking portions of the first plurality of rows and the second plurality of rows; and
a transition line; and
a plurality of pixel circuitry units coupled to the first and second pluralities of rows of crystallized material, wherein the every other pixel circuitry unit of the plurality of pixel circuitry units in the overlap region is coupled to a row of the first plurality of rows and the intervening pixel circuitry units are coupled to a row of the second plurality of rows.

5. The electronic display of claim 4, wherein the transition line is substantially vertical and central to the overlap region.

6. The electronic display of claim 4, comprising an organic light emitting diode (OLED) layer comprising a plurality of OLEDs each coupled to a respective transistor of the first and second pluralities of transistors.

7. An electronic device comprising:
a display comprising:
a backplane comprising:
a first column of a first plurality of rows of crystallized material vertically separated by a first plurality of gaps;
a second column of a second plurality of rows of crystallized material vertically separated by a second plurality of gaps; and
an overlap region comprising an interlocking arrangement of the first plurality of rows and the second plurality of rows;
a plurality of pixel circuitry units coupled to the first and second pluralities of rows of crystallized material, wherein the every other pixel circuitry unit of the plurality of pixel circuitry units in the overlap region is coupled to a row of the first plurality of rows and the intervening pixel circuitry units are coupled to a row of the second plurality of rows.

8. The electronic device of claim 7, each transition of the plurality of transitions is horizontally offset from a vertically adjacent transition.

9. The electronic device of claim 7, wherein each transition of the plurality of transitions is horizontally offset from a vertically adjacent transition.

10. The electronic device of claim 7 comprising a plurality of organic light emitting diodes (OLED) each coupled to a corresponding transistor of the first or second plurality of transistors.

11. The electronic device of claim 7, wherein the first and second plurality of transistors each comprise thin film transistors.

12. An electronic display comprising:
a backplane comprising:
a plurality of rows of crystallized material, wherein each row of the plurality of rows comprises:
a first sub-row; and
a second sub-row that is parallel to the first sub-row, wherein the second sub-row is vertically and horizontally offset from the first sub-row, and wherein the first and second sub-rows horizontally intermesh in an intermeshed region without overlaying each other; and
a plurality of pixel circuitry units coupled to the plurality of rows of crystallized material, wherein the every other pixel circuitry unit of the plurality of pixel circuitry units in the intermeshed region is coupled to the first sub-row and the intervening pixel circuitry units are coupled to the second sub-row.

13. The electronic display of claim 12, comprising an organic light emitting diode (OLED) layer comprising a plurality of OLEDs each coupled to a respective pixel circuitry unit of the plurality of pixel circuitry units.

14. The electronic display of claim 12, wherein a first row of the plurality of rows comprises a first arrangement of pixel circuitry units in the intermeshed region and a second row of the plurality of rows comprises a second arrangement of pixel circuitry units in the intermeshed region, wherein the first and second arrangement are inverted between the first and second sub-rows.

15. The electronic display of claim 12, wherein each of the pixel circuitry units of the plurality of pixel circuitry units comprises a thin film transistor.

* * * * *